(12) United States Patent
Lin

(10) Patent No.: US 8,124,513 B2
(45) Date of Patent: Feb. 28, 2012

(54) GERMANIUM FIELD EFFECT TRANSISTORS AND FABRICATION THEREOF

(75) Inventor: Jing-Cheng Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 145 days.

(21) Appl. No.: 12/630,652

(22) Filed: Dec. 3, 2009

(65) Prior Publication Data

US 2010/0237444 A1     Sep. 23, 2010

Related U.S. Application Data

(60) Provisional application No. 61/161,253, filed on Mar. 18, 2009.

(51) Int. Cl.
*H01L 29/78* (2006.01)
(52) U.S. Cl. ............... 438/591; 438/43; 438/196
(58) Field of Classification Search .............. 438/591, 438/43, 196, 197, 287, 585, 587
See application file for complete search history.

(56) References Cited

U.S. PATENT DOCUMENTS

| | | | |
|---|---|---|---|
| 5,019,882 A | | 5/1991 | Solomon et al. |
| 5,312,766 A | * | 5/1994 | Aronowitz et al. ........... 438/291 |
| 5,473,171 A | | 12/1995 | Summerfelt |
| 5,521,108 A | * | 5/1996 | Rostoker et al. ............. 438/260 |
| 6,461,945 B1 | | 10/2002 | Yu |
| 7,145,167 B1 | | 12/2006 | Chu |
| 7,221,006 B2 | | 5/2007 | Orlowski et al. |
| 7,259,388 B2 | | 8/2007 | Langdo et al. |
| 7,465,618 B2 | * | 12/2008 | Hayashi et al. ............... 438/197 |
| 2005/0142769 A1 | | 6/2005 | Kamata et al. |
| 2006/0289895 A1 | | 12/2006 | Kamata |
| 2007/0057347 A1 | | 3/2007 | Ikeda |
| 2007/0138565 A1 | | 6/2007 | Datta et al. |
| 2008/0258264 A1 | | 10/2008 | Kamata et al. |

OTHER PUBLICATIONS

Kuzum, D., et al., "Interface-Engineered Ge (100) and (111), N- and P-FETs with High Mobility", Electronic Devices Meeting 2007, IEDM 2007, IEEE International, pp. 723-726.

Lee, M.L., et al., "Strained Si, SiGe, and Ge Channels for High-Mobility Metal-Oxide-Semiconductor Field-Effect. Transistors", Applied Physics Reviews—Focused Review, J. Appl. Phys. 011101 (2005), 27 pages.

Leys, F.E., et al., "Epitaxial strained Si as a passivation method for the Ge/high-k interface in Ge MOSFET structures: Current understanding and future directions", International SiGe Technology and Device Meeting, Taiwan, May 2008, 2 pages.

Mitard, J., et al., "Record $I_{on}/I_{off}$ Performance for 65nm Ge pMOSFET and novel Si passivation scheme for improved EOT scalability", Electron Devices Meeting, 2008, IEDM 2008, IEEE International, 4 pages.

Nicholas, G., et al., "High Mobility Strained Ge PMOSFETs with High-*K*/Metal Gate", IEEE Electron Device Letters, vol. 28, No. 9, Sep. 2007, pp. 825-827.

(Continued)

*Primary Examiner* — Roy Potter
(74) *Attorney, Agent, or Firm* — Slater & Matsil, L.L.P.

(57) ABSTRACT

Germanium field effect transistors and methods of fabricating them are described. In one embodiment, the method includes forming a germanium oxide layer over a substrate and forming a metal oxide layer over the germanium oxide layer. The germanium oxide layer and the metal oxide layer are converted into a first dielectric layer. A first electrode layer is deposited over the first dielectric layer.

18 Claims, 10 Drawing Sheets

OTHER PUBLICATIONS

Pantisano, L., et al., Fundamentals and Extraction of Velocity Saturation in Sub-100nm (110)-Si and (100)-Ge, 2008 Symposium on VLSI Technology Digest of Technical Papers, 2008 IEEE, pp. 52-53.

Prabhakaran, K., et al., "In situ oxidation of a thin layer of Ge on Si(001): Observation of GeO to $SiO_2$ transition", Appl. Phys. Lett. 62 (8), Feb. 22, 1993, pp. 864-866.

Shang, H., et al., "Channel Design and Mobility Enhancement in Strained Germanium Buried Channel MOSFETs", 2004 Symposium on VLSI Technology Digest of Technical Papers, 2004 IEEE, pp. 204-205.

Weber, O., et al., "Strained Si and Ge MOSFETs with High-K/Metal Gate Stack for High Mobility Dual Channel CMOS", Electron Devices Meeting, 2005, IEDM Technical Digest, IEEE International, 4 pages.

Bellenger, F., et al., "Interface Properties Improvement of $Ge/Al_2O_3$ and $Ge/GeO_2/Al_2O_3$ Gate Stacks using Molecular Beam Deposition," The Electrochemical Society, ECS Transactions, 16 (5) (2008), pp. 411-422.

Kita, K., et al., "Direct Evidence of GeO Volatilization from $GeO_2$/Ge and Impact of Its Suppression on $GeO_2$/Ge Metal-Insulator-Semiconductor Characteristics," Japanese Journal of Applied Physics, Vo. 47, No. 4, 2008, pp. 2349-2353.

\* cited by examiner

US 8,124,513 B2

GERMANIUM FIELD EFFECT TRANSISTORS AND FABRICATION THEREOF

This application claims the benefit of U.S. Provisional Application No. 61/161,253, entitled "Germanium Field Effect Transistors and Fabrication Thereof," filed on Mar. 18, 2009, which is incorporated herein by reference.

TECHNICAL FIELD

The present invention relates generally to semiconductor devices, and more particularly to germanium field effect transistors, and methods of fabrication thereof.

BACKGROUND

The semiconductor industry is facing unprecedented challenges due to the limitations of traditional transistor scaling arising from non-scaling of conventional materials (e.g., gate oxide). The industry has aggressively adopted new methods for performance enhancements, like strained silicon. However, continued scaling with strain is expected to be challenging due to increase in defectivity and possible saturation of strain effects. Hence, there is a renewed interest in the integration of group III-V semiconductors and/or group IV semiconductors as new channel materials. This is driven by the need to enhance channel transport as well as to reduce power dissipation. The ability to grow high-quality high-k dielectrics has rejuvenated the possibility of using these alternate substrates.

Germanium based devices are one of the key contenders for replacing silicon as the channel material due to the higher electron and hole mobilities in germanium as compared to silicon. For example, it has been shown that germanium-based transistors can exhibit a 400% greater hole mobility, and a 250% greater electron mobility, than silicon-based transistors. The higher mobility promises improvements in drive currents much beyond that achievable from comparable silicon devices.

In theory, it is possible to make transistors with bulk germanium or Germanium on Insulator (GeOI) substrates that are much faster than those currently made from bulk silicon or SOI ("Silicon-On-Insulator") substrates. However, a number of practical limitations and challenges have to be overcome to enable such germanium based devices. One such limitation involves the formation of the gate dielectric.

Unlike silicon, germanium does not form a stable oxide. Germanium oxides are volatile and introduce a large number of defect states resulting in poor device reliability. Reliability issues can negate the possible improvements achievable by using germanium transistors. Hence, what is needed are structures and methods of forming gate dielectrics for germanium transistors without degrading device reliability and/or performance.

SUMMARY OF THE INVENTION

These and other problems are generally solved or circumvented, and technical advantages are generally achieved, by preferred embodiments of the present invention.

Embodiments of the invention include germanium transistors and methods of fabrication thereof. In accordance with an embodiment of the invention, a method for fabricating a semiconductor device comprises forming a germanium oxide layer over a substrate, and forming a metal oxide layer over the germanium oxide layer. The method further comprises converting the germanium oxide layer and the metal oxide layer into a first dielectric layer, and depositing a first electrode layer over the first dielectric layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 3, which includes FIGS. 3a and 3b, illustrates chemical composition and device performance of a germanium capacitor fabricated using embodiments of the invention, wherein FIG. 3a illustrates a germanium XPS data of gate dielectric layers during fabrication of the capacitor, and FIG. 3b illustrates a capacitance-voltage (CV) sweep of the germanium capacitor; and FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
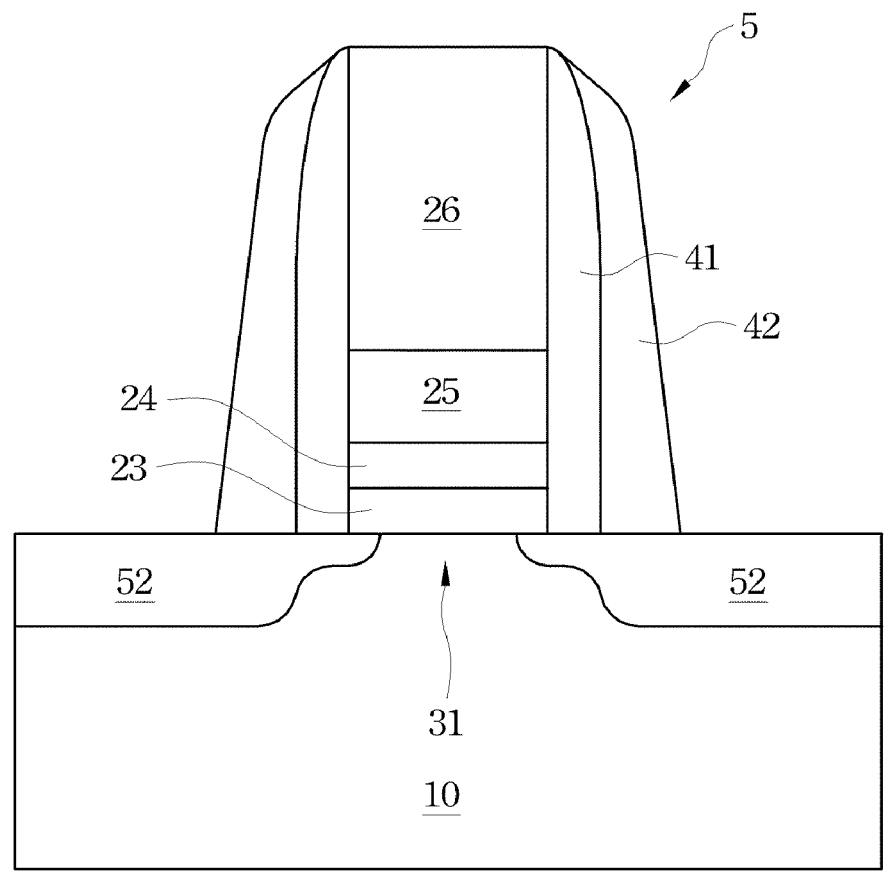
FIG. 1 is a structural embodiment of a germanium field effect transistor (FET)

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely, germanium channel field effect transistors. The invention may also be applied, however, to other types of devices and channel materials.

One of the challenges in forming germanium transistors is to form gate dielectrics with a high dielectric constant without introducing defects such as interface states or bulk charge traps. However, unlike silicon, germanium does not form stable oxides with low defect density. Rather, germanium dioxide has a high defect density, for example, interface trap densities higher than about $1 \times 10^{12}/cm^2$. One way to reduce defects is by annealing the oxide. However, oxides of germanium are unstable at high temperatures. For example, germanium dioxide is volatile above 700° C. Further, germanium dioxide decomposes if exposed to moisture. Sub-oxides of germanium are unstable at even lower temperatures (for example, about 400° C.).

Various researchers have tried to overcome these challenges by forming high-k dielectric layers directly on the germanium surface. However, the interface between the high-k dielectric layers and the germanium is extremely defective. The high interface charge shields the gate potential from the semiconductor substrate, resulting in poor capacitance behavior. This is because the high-k dielectrics grow from the terminal germanium atoms of the semiconductor substrate 10. A large change in crystal structure between the semiconductor substrate (germanium) and the high-k dielectric layer results in a large number of interface traps due to unterminated germanium or high-k dielectric atoms (or hydrogen terminated atoms that are easily broken under potential).

Yet another technique involves forming a silicon cap layer or a passivation layer on the germanium layer. The silicon cap layer is partially converted into a silicon oxide layer which forms the gate insulator. A good quality high-k dielectric layer can be grown on the silicon oxide layer. While the defect density of this process is low, the band gap of germanium is lower than silicon. Hence, for a given gate potential and doping, germanium is inverted before the silicon cap layer. Hence, the channel of the transistor is formed in the germanium layer under the remaining silicon cap layer. The silicon layer formed between the $SiO_2$ gate dielectric and the germanium channel results in an increase in electrical oxide thickness of the transistor. The increase in electrical oxide thickness offsets any gains from increased mobility in the channel region.

In various embodiments, the invention overcomes these limitations by forming a stabilized germanium oxide. The use of germanium oxide ensures a low defect concentration, while a stabilizer prevents environmental degradation of the germanium oxide. In various embodiments, the oxide of germanium is thus stabilized by a stabilizing metal. The stabilizing metal couples to the unstable germanium oxide and forms a stable oxide which is also low in defect density (for example, less than about $10^{12}/cm^{-2}$).

FIG. 1 illustrates a metal insulator semiconductor field effect transistor (MISFET) 5 disposed in a semiconductor substrate 10. In various embodiments, the semiconductor substrate 10 comprises a bulk mono-crystalline germanium substrate, a germanium layer on a semiconductor body, for example, a germanium layer on a silicon substrate, or a layer of a germanium-on-insulator (GeOI) substrate.

The MISFET 5 comprises a gate dielectric stack comprising a first dielectric layer 23 and a second dielectric layer 24. In various embodiments, the first dielectric layer 23 comprises MGeO, for example, an oxide comprising germanium oxide (GeO) and a stabilizing metal (M) oxide. The composition of the first dielectric layer 23 comprises $M_zGe_yO_x$, wherein a ratio of x and y is about 0.2 to about 5, and wherein a ratio of x and z is about 0.2 to about 5. The stabilizing metal (M) comprises Al, Hf, Ti, Ta, La, Zr, W, Gd, or combinations, and the like. In various embodiments, the stabilizing metal bonds with oxygen atoms and stabilizes the oxide network. Unlike high-k dielectric layers formed independently on the semiconductor substrate 10, the stabilizing metal does not significantly change the interface between Ge/GeO resulting in low interface defect densities, for example, less than about $1\times10^{11}/cm^{-2}$. In various embodiments, the dielectric constant of the first dielectric layer 23 is greater than the dielectric constant of germanium oxide. In some embodiments, the first dielectric layer 23 further comprises halogen atoms. In one embodiment, the first dielectric layer 23 comprises fluorine, e.g., $M_zGe_yO_xF_w$, wherein a ratio of x and y is about 0.2 to about 5, wherein a ratio of x and z is about 0.2 to about 5, and a ratio of w and y is about 0.01 to about 1.

The second dielectric layer 24 comprises a suitable dielectric layer and includes a high-k dielectric material. In various embodiments, the dielectric constant of the second dielectric layer 24 is greater than the dielectric constant of the first dielectric layer 23. In various embodiments, a high-k dielectric material having a dielectric constant of about 5.0 or greater is used as the second dielectric layer 24. Suitable high-k materials include metal oxides ($MO_x$) such as $HfO_2$, $Al_2O_3$, $ZrO_2$, $Ta_2O_5$, $La_2O_3$, $GdO_x$, $GdAlO_x$, metal silicates ($MSi_yO_x$) such as $HfSiO_x$, $ZrSiO_x$, $SiAlO_x$ metal germanate ($MGe_yO_x$) such as $HfGeO_x$, $ZrGeO_x$, $LaGeO_x$, $GdGeO_x$, and/or $GeAlO_x$. Various embodiments also include high-k dielectric materials having multiple metals, for example, a first metal $M_1$ and a second metal $M_2$. In one embodiment, a metal oxide comprising a first metal $M_1$ and a second metal $M_2$ and including $HfAlO_x$, $HfZrO_x$, $ZrAlO_x$, $LaAlO_x$, $TaAlO_x$, and/or $GdAlO_x$ may be used as the second dielectric layer 24. In another embodiment, silicates or germanate including $HfSiAlO_x$, $ZrSiAlO_x$, $HfZrSiO_x$, $HfGeAlO_x$, and/or $ZrGeAlO_x$, $HfZrGeO_x$ may be used as the second dielectric layer 24. The nitrides and combinations of the above, while not specifically illustrated, may be used in some embodiments. Alternatively, the second dielectric layer 24 can comprise other high-k insulating materials or other dielectric materials. The second dielectric layer 24 may comprise a single layer of material, or alternatively multiple layers.

A first gate electrode layer 25 is disposed on the second dielectric layer 24. The first gate electrode layer 25 comprises a conductive material such as a metal gate electrode material. In various embodiments, the first gate electrode layer 25 comprises metal nitrides such as TiN, TaN, MoN, HfN, and/or TiAlN. In other embodiments, the first gate electrode layer 25 comprises TiC, HfN, TaC, W, Al, Ru, RuTa, TaSiN, $NiSi_x$, $CoSi_x$, $TiSi_x$, Ir, Y, $YbSi_x$, $ErSi_x$, Pt, Ti, PtTi, Pd, Re, Rh, borides, phosphides, or antimonides of Ti, Hf, Zr, Mo, ZrSiN, ZrN, HfSiN, WN, Ni, Pr, VN, TiW, and/or combinations thereof. In one embodiment, the first gate electrode layer 25 comprises a doped polysilicon layer or a silicide layer (e.g., titanium silicide, nickel silicide, tantalum silicide, cobalt silicide, or platinum silicide). The thickness of the first gate electrode layer 25 is selected to tune its work function.

A second gate electrode layer 26 is disposed on the first gate electrode layer 25. The second gate electrode layer 26 comprises a doped polysilicon layer in one embodiment. In various embodiments, the second gate electrode layer 26 comprises a suitable conductive material. In one embodiment, the first and the second gate electrode layers 25 and 26 comprise a same material.

The MISFET 5 further comprises a channel 31 disposed between adjacent source/drain regions 52. The channel 31 comprises germanium in various embodiments. The source/drain regions 52 comprise a doping opposite to the channel 31. The source/drain regions 52 comprise germanium in one embodiment. While forming source/drain regions 52 and the channel 31 with a same material is beneficial to reduce processing costs, germanium-based transistors suffer from excessive leakage currents (low energy band gap) and high junction capacitance (high dielectric constant of germanium). Hence, in some embodiments, the source/drain regions 52 may comprise other materials to mitigate, for example, subthreshold leakage (source to drain tunneling) currents arising due to the smaller band gap of germanium. In one embodiment, the source/drain regions 52 comprise silicon. Silicon source/drain regions 52 will introduce a tensile strain in the channel 31 of the transistor, which may improve n-type FET with a channel 31 (e.g., semiconductor substrate with a (100) germanium surface). In some embodiments, an additional material layer may be introduced at the junction between the channel 31 and the source/drain regions 52 to mitigate short channel effects.

The MISFET 5 also comprises drain extension spacers 41 and source/drain spacers 42 in one embodiment. In various embodiments, the spacers may be formed in any suitable shape to separate the various regions of the MISFET 5 from any of the gate electrode layers.

In one embodiment, the MISFET 5 comprises either a p-channel transistor or an re-channel transistor device, although the pMOS has a substantial potential for improvement in performance relative to a silicon device. Unlike other group III-V semiconductor substrates, a single germanium substrate may be used for both n-type and p-type transistors, albeit sacrificing some performance for the n-type transistors in return for simpler integration. However, embodiments of the invention also include using a germanium substrate and a metal stabilized germanium oxide only for the p-type transistor. While a planar transistor is illustrated, in various embodiments, the MISFET 5 comprises a triple gate or a double gate device.

FIG. 2, which includes FIGS. 2a-2d, illustrates a metal insulator semiconductor device in various stages of fabrication.

Figure 2A:
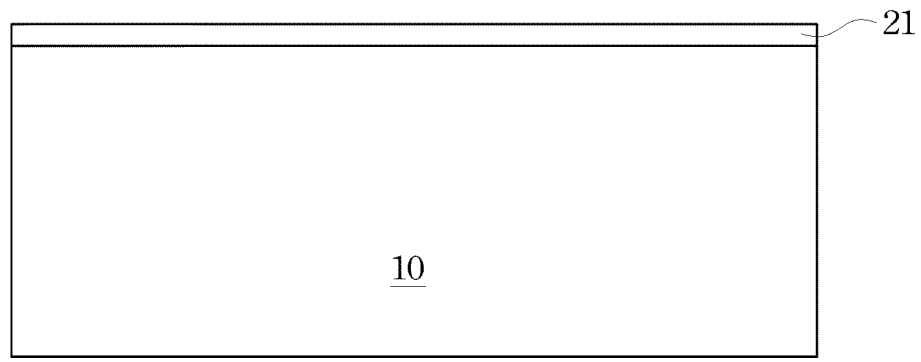
FIGS. 2a-2d, illustrates a germanium capacitor in various stages of fabrication in accordance with embodiments of the invention.

Referring first to FIG. 2a, a semiconductor substrate 10 is provided. In one embodiment, the semiconductor substrate 10 is a germanium wafer. In various embodiments, the semiconductor substrate 10 is a bulk mono-crystalline germanium substrate (or a layer grown thereon or otherwise formed therein), a germanium layer on a semiconductor body, a layer of {110} germanium on a {100} germanium wafer, or a layer of a germanium-on-insulator (GeOI) wafer. The semiconductor substrate 10 is doped with a suitable p-type or n-type dopant to form a surface layer of appropriate conductivity, for example, by implant and annealing steps.

An insulating layer 21 is deposited over exposed portions of the semiconductor substrate 10. In one embodiment, the insulating layer 21 comprises a germanium oxide (e.g., GeO, and/or $GeO_2$), a nitride (e.g., GeN), or a combination of oxide and nitride (e.g., GeON, or an oxide-nitride-oxide sequence). The insulating layer 21 is deposited by oxidation of the semiconductor substrate 10. In one embodiment, the semiconductor substrate 10 is subjected to oxygen plasma comprising $O_2/N_2$, $O_2$, $O_3$ and/or atomic oxygen forming an oxide layer. In one embodiment, the oxygen is supplied as molecular oxygen into the plasma chamber at a flow rate of about 250 sccm to about 1000 sccm, and at about 10 Torr to about 100 Torr of oxygen partial pressure. In an embodiment, an oxidation process comprising $O_2$ is performed at an $O_2$ partial pressure of about 10 Torr to about 720 Torr, and oxidation temperature of about 250° C. to about 500° C. In an alternative embodiment, an oxidation process comprising $O_3$ is performed at an $O_3$ partial pressure of about 0.005 Torr to about 0.5 Torr, and oxidation temperature of about 200° C. to about 500° C. The oxidation using $O_3$ proceeds faster than $O_2$ oxidation and hence the partial pressure using $O_3$ is smaller than that with $O_2$.

Alternatively, in other embodiments, the insulating layer 21 is formed by a high temperature thermal oxidation process. In other embodiments, any suitable deposition techniques including atomic layer deposition, plasma vapor deposition, or chemical vapor deposition may be used. In various embodiments, the insulating layer 21 comprises a thickness of a single mono-layer (about 2 Å) to about 30 Å, and less than about 16 Å in one embodiment.

Alternatively, in some embodiments, halogen atoms such as fluorine are incorporated into the insulating layer 21. In one embodiment, forming the insulating layer 21 comprises forming a fluorinated germanium oxide ($GeO_xF_w$). In one embodiment, during oxidation of the substrate 10, diluted $NF_3$ is introduced into the oxidation chamber. The amount of fluorine incorporated into the insulating layer 21 is controlled, for example, by controlling the flow rate ratio (flow rate of $NF_3$/flow rate of oxygen source) of the $NF_3$ gas. In various embodiments, the $NF_3$ flow rate ratio is about $1 \times 10^{-3}$ to about $1 \times 10^{-1}$. Further, in some embodiments, the NF3 source may be switched off after the growth of a few mono layers of the insulating layer 21 such that the halogen atoms are incorporated at the interface between the insulating layer 21 and the substrate 10. The halogen atoms help to saturate the dangling bonds of the substrate 10 and thus remove trap states at the interface between the insulating layer 21 and the substrate 10.

Figure 2B:
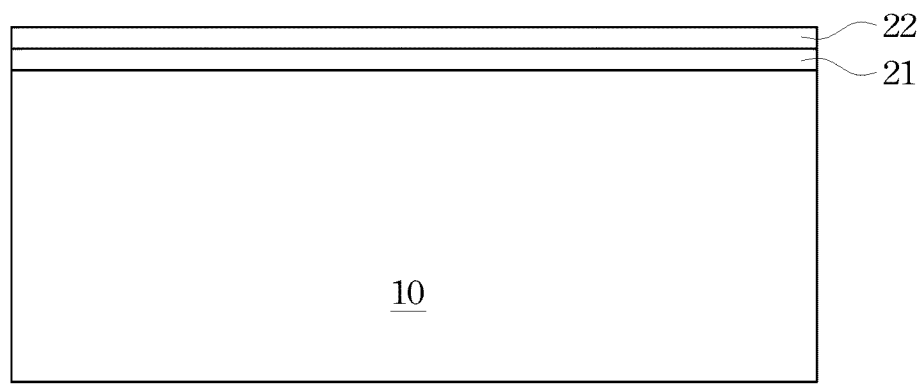

As illustrated in FIG. 2b, a temporary material layer 22 is deposited over the first insulating layer 21. In various embodiments, the temporary material layer 22 comprises a stabilizing metal. The stabilizing metal (M) comprises Al, Hf, Ti, Ta, La, Zr and/or W and the like. In one embodiment, the stabilizing metal comprises aluminum. The temporary material layer 22 comprises an insulating material in one embodiment. In an alternative embodiment, the temporary material layer 22 comprises a conductive layer comprising the stabilizing metal.

The temporary material layer 22 is deposited by chemical vapor deposition (CVD), atomic layer deposition (ALD), metal organic chemical vapor deposition (MOCVD), physical vapor deposition (PVD), or jet vapor deposition (JVD), as examples. The temporary material layer 22 comprises a thickness of a single mono-layer (about 2 Å) to about 30 Å, and less than about 16 Å in one embodiment. In one embodiment, the thickness of the temporary material layer 22 is about the same as the insulating layer 21.

In some embodiments, an implant of halogen atoms may be used to incorporate halogen atoms into the interface between the insulating layer 21 and the substrate 10. In various embodiments, fluorine may be implanted into the substrate 10, the insulating layer 21, and/or the temporary material layer 22.

Figure 2C:
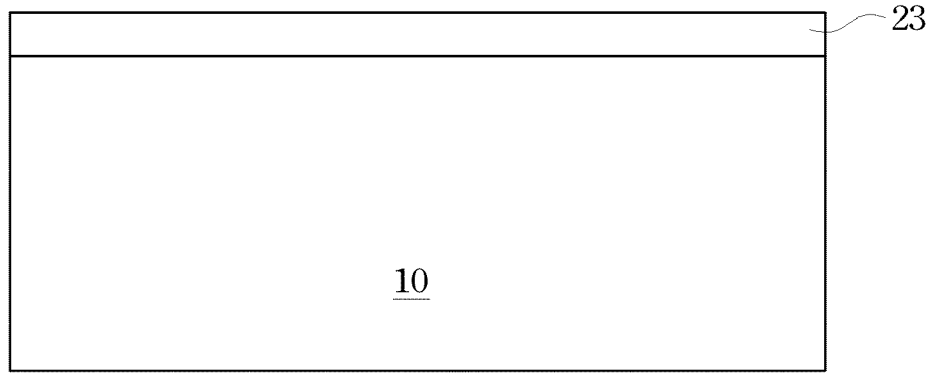

Referring to FIG. 2c, the semiconductor substrate 10 is heated to form a first dielectric layer 23. In one embodiment, the semiconductor substrate 10 is heated in a furnace at about 250° C. to about 500° C. During the annealing, atoms of the semiconductor substrate 10 (germanium) from the insulating layer 21 out-diffuse into the temporary material layer 22, while the stabilizing metal atoms from the temporary material layer 22 diffuse into the insulating layer 21. The first dielectric layer 23 thus formed comprises atoms of the insulating layer 21 and the temporary material layer 22 forming a dielectric material. The composition of the first dielectric layer 23 comprises $M_zGe_yO_x$, wherein a ratio of x and y is about 0.2 to about 5, and wherein a ratio of x and z is about 0.2 to about 5. The dielectric constant of the first dielectric layer 23 is greater than 5. In one embodiment, the dielectric constant of the first dielectric layer 23 is greater than the dielectric constant of the insulating layer 21. If halogen atoms such as fluorine are incorporated into the substrate 10, the insulating layer 21, and/or the temporary material layer 22, the first dielectric layer 23 may comprise fluorine upon the heating. For example, if the insulating layer 21 comprises a fluorinated germanium oxide ($GeO_xF_w$), the first dielectric layer 23 formed subsequently comprises a fluorinated metal germanate ($M_zGe_yO_xF_w$).

Alternatively, in one embodiment, a sequential atomic layer deposition process may be used to form a laminar film comprising layers of insulating layer 21 and temporary material layer 22. After first depositing the insulating layer 21, the gas chemistry is changed to deposit a layer of the temporary material layer 22, thus forming a first stack of the laminar film. After depositing the temporary material layer 22, a second stack is formed on the first stack, the second stack comprising another insulating layer 21 and another temporary material layer 22. The stacks are sequentially formed until the desired thickness is deposited. After forming each stack, an optional anneal may be performed to form a layer of the first dielectric layer 23. Alternatively, a final anneal is performed that forms the first dielectric layer 23.

Figure 2D:
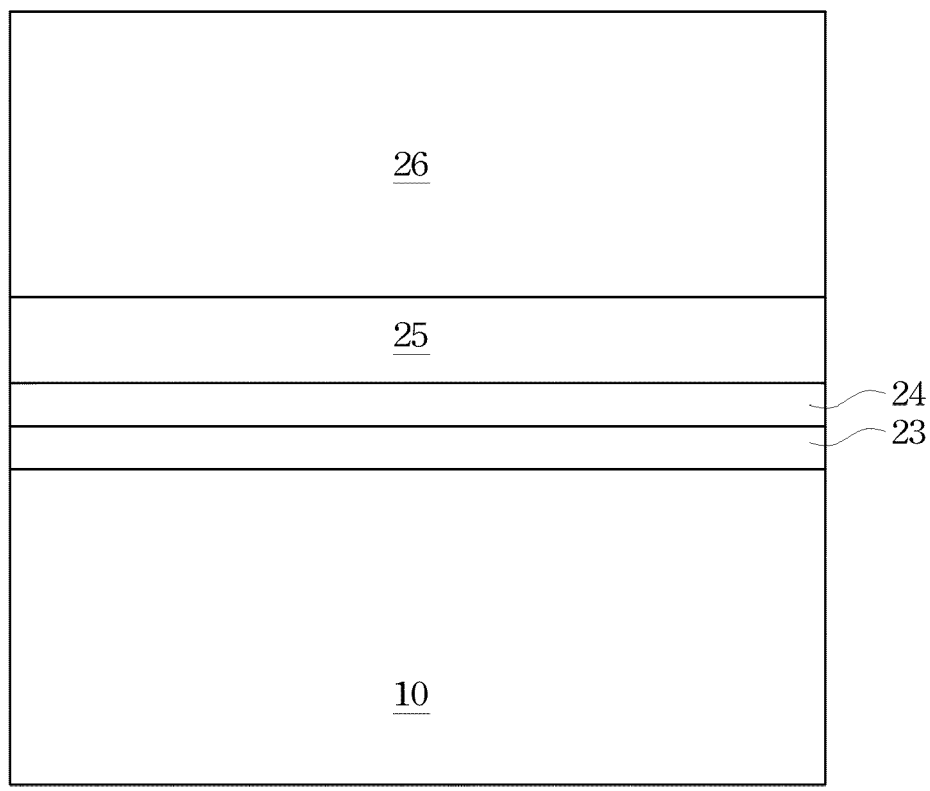

Referring to FIG. 2d, a second dielectric layer 24 is formed on the first dielectric layer 23. The second dielectric layer 24 comprises a high-k dielectric material having a dielectric constant greater than about 5.0. Suitable high-k materials with a dielectric constant greater than 10 include $HfO_2$, $ZrO_2$, $Ta_2O_5$, $La_2O_3$, $TiO_2$, $Dy_2O_3$, $Y_2O_3$, nitrides thereof, and combinations thereof, as examples. Alternatively, high-k materials with dielectric constants greater than 5 may include $HfSiO_x$, $Al_2O_3$, $ZrSiO_x$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, as examples.

The second dielectric layer 24 is deposited using any suitable deposition technique including atomic layer deposition (ALD), metal organic chemical vapor deposition (MOCVD), and other vapor deposition techniques. The second dielectric layer 24 preferably comprises a thickness of about 5 Å to about 100 Å in one embodiment, although alternatively, the second dielectric layer 24 may comprise other dimensions. The second dielectric layer 24 may be skipped and subsequent processing may be performed in some embodiments.

A first gate electrode layer 25 comprising a conductive material is deposited on the second dielectric layer 24 (FIG. 2d). In various embodiments, the first gate electrode layer 25 comprises metal nitrides such as TiN, TaN, MoN, HfN, and/or TiAlN. In one embodiment, the first gate electrode layer 25 comprises a germanide layer (e.g., titanium germanide, nickel germanide, tantalum germanide, cobalt germanide, or platinum germanide). In other embodiments, other suitable metals are deposited. The first gate electrode layer 25 having a thickness of between about 5 Å to 200 Å is deposited using CVD, PVD, ALD, or other deposition techniques.

A second gate electrode layer 26 is deposited on the first gate electrode layer 25. The second gate electrode layer 26 comprises a doped polysilicon layer in one embodiment. In various embodiments, the second gate electrode layer 26 comprises a suitable conductive material. In one embodiment, the first and the second gate electrode layers 25 and 26 comprise a same material. The second gate electrode layer 26 having a thickness of between about 200 Å to 1000 Å is deposited using CVD, PVD, ALD, or other deposition techniques.

Subsequent processing continues to form contacts and any other device regions forming a metal insulator semiconductor (MIS) capacitor. The MIS capacitor thus formed comprises a first electrode comprising the first gate electrode layer 25 and separated from a second electrode comprising the semiconductor substrate 10. The insulator of the MIS capacitor comprises the first dielectric layer 23 and the second dielectric layer 24.

Figure 3A:
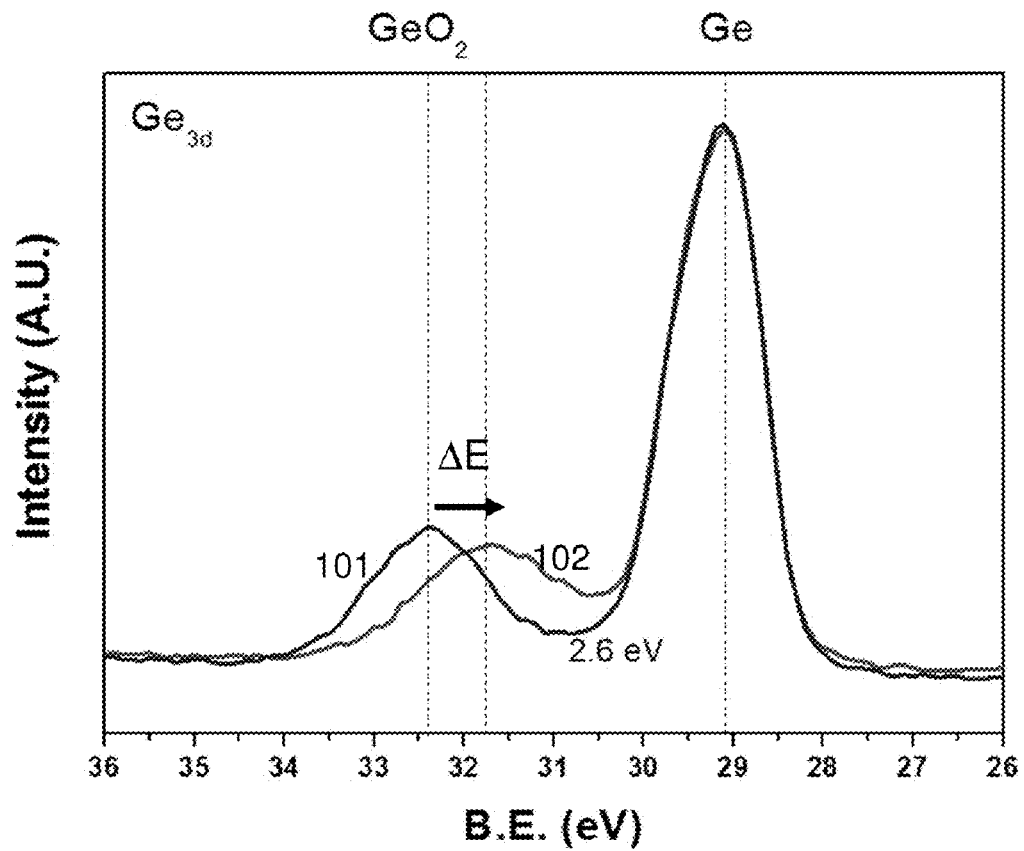
Figure 3B:
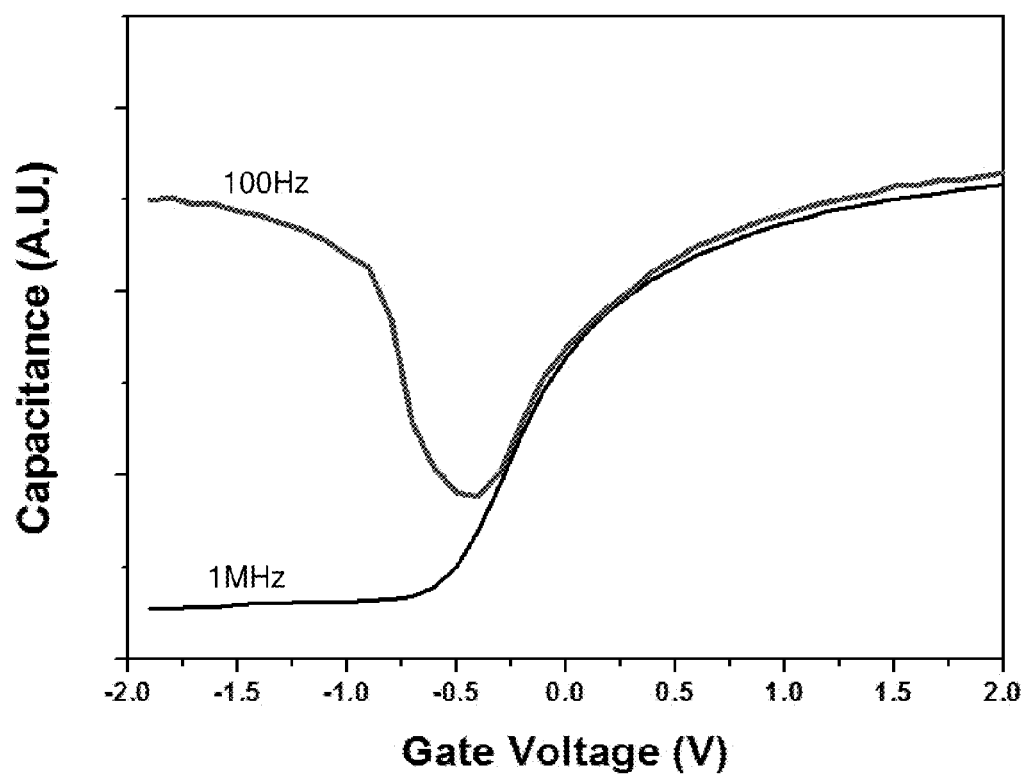

FIG. 3, which includes FIGS. 3a and 3b, illustrates a capacitor fabricated using embodiments of the invention, wherein FIG. 3a illustrates an X-ray photoelectron spectroscopy (XPS) spectra and FIG. 3b illustrates a capacitance-voltage (CV) sweep.

FIG. 3a illustrates the germanium XPS spectra of the gate dielectric layer during various stages of fabrication shown in FIG. 2. XPS is a surface chemical analysis technique used to analyze the surface chemistry of a gate dielectric layer after fabrication. An XPS spectrum illustrates the intensity of electrons detected (Y-axis) versus the binding energy of the electrons detected (X-axis). For example, for each element, the characteristic peaks correspond to the electron configuration of the electrons within the atoms, e.g., 1s, 2s, 2p, 3s, etc. Hence, a change in peak distribution shows a change in bonding.

FIG. 3a illustrates a first curve 101 and a second curve 102. The first curve 101 is the XPS spectra after forming a germanium oxide layer (for example, insulating layer 21 in FIG. 2a). The first curve 101 comprises a first peak for germanium (about 29 eV) and a second smaller peak (about 32.4 eV) for a $Ge^{4+}$ state which is from germanium dioxide ($GeO_2$).

The second curve 102 is the XPS spectra after forming the first dielectric layer 23 (as illustrated in FIG. 2c). Due to the formation of the first dielectric layer 23, the peak has shifted to about 31.7 eV (shown by shift energy ΔE). The substantial decrease in intensity at the $GeO_2$ binding energy (at about 32.4 eV) illustrates a corresponding decrease in the number of $GeO_2$ bonds.

Capacitance voltage (CV) sweeps of a germanium metal oxide semiconductor capacitor (MOSCAP), for example, as fabricated using the method in FIG. 2 or as shown in FIG. 1, is illustrated in FIG. 3b. The capacitance is plotted against the potential at the gate electrode. Unlike a germanium oxide capacitor or a pure high-k dielectric capacitor, the CV sweep of the germanium MOSCAP exhibits excellent behavior at both high frequency (1 MHz) and low frequency (100 Hz) sweeps, and does not show any pinning.

FIG. 4, which includes FIGS. 4a-4g, illustrates a MISFET device in various stages of fabrication.

Figure 4A:
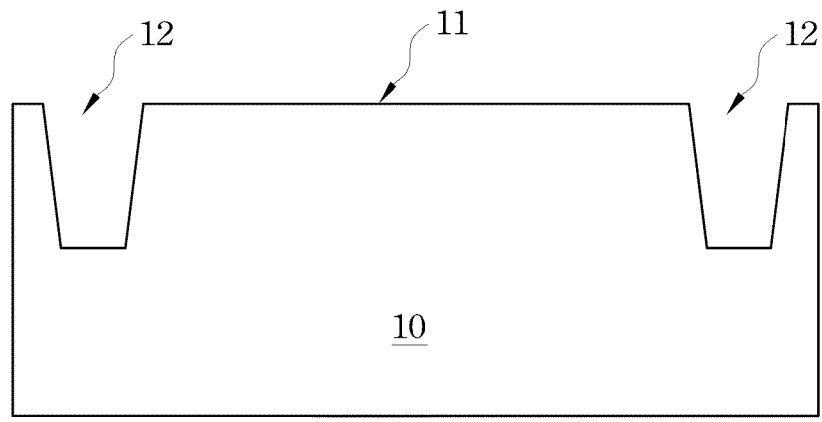
FIGS. 4a-4g, illustrates a germanium FET in various stages of fabrication in accordance with embodiments of the invention.

Referring to FIG. 4a, isolation trenches 12 are formed in the semiconductor substrate 10. Conventional techniques may be used to form the isolation trenches 12. For example, a hard mask layer (not shown here), such as silicon nitride, can be formed over the semiconductor substrate 10 and patterned to expose the isolation areas. The exposed portions of the semiconductor substrate 10 can then be etched to the appropriate depth, which is typically between about 200 nm and about 400 nm. The isolation trenches 12 define active area 11, in which integrated circuit components can be formed.

Figure 4B:
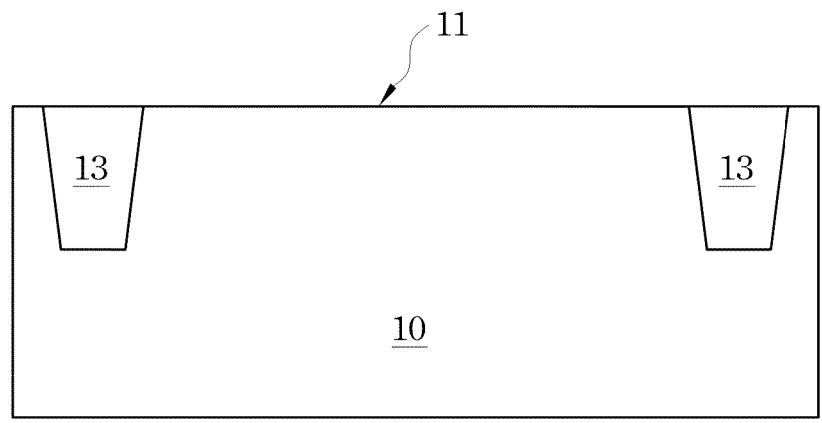

Referring now to FIG. 4b, the isolation trenches 12 are filled with an isolating material forming shallow trench isolation 13. For example, exposed silicon surfaces can be thermally oxidized to form a thin oxide layer. The isolation trenches 12 can then be lined with a first material such as a nitride layer (e.g., $Si_3N_4$). The isolation trenches 12 can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with other fill materials.

Figure 4C:
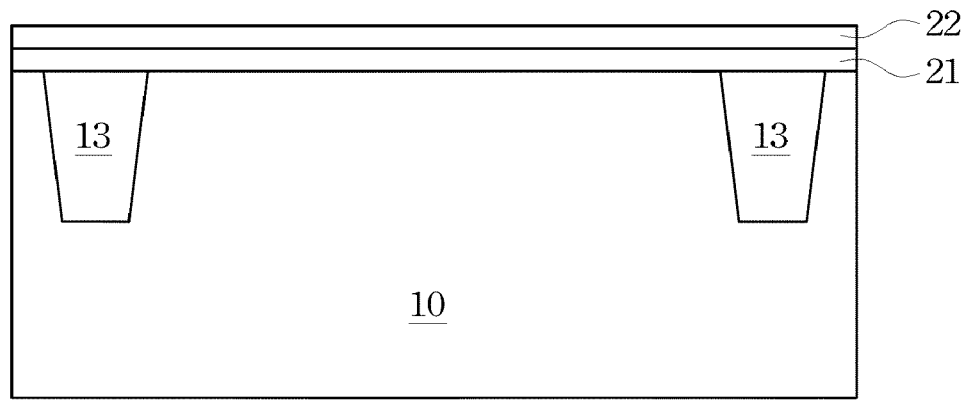

A gate insulator stack comprising an insulating layer 21 and a temporary material layer 22 is formed as illustrated in FIG. 4c (and as described in FIGS. 2a and 2b). In various embodiments, the insulating layer 21 comprises a germanium oxide (e.g., $GeO_2$), and the temporary material layer 22 comprises a stabilizing metal. As described above, the stabilizing metal helps to stabilize the oxide in the insulating layer 21.

Figure 4D:
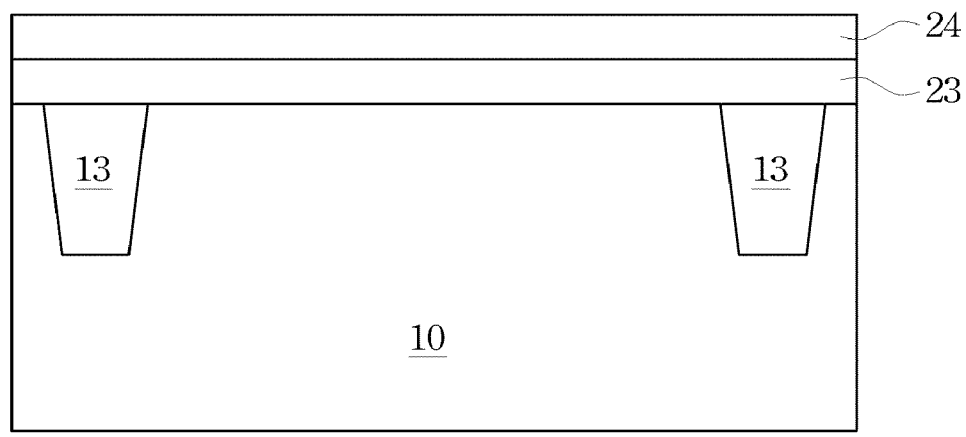

Referring to FIG. 4d, a gate dielectric comprising a first gate dielectric layer 23 and a second gate dielectric layer 24 is formed. The gate insulator stack is annealed to form a first gate dielectric layer 23 as described in FIG. 2c. The first dielectric layer 23 thus formed comprises atoms of the insulating layer 21 and the temporary material layer 22 forming a dielectric material (as also described in FIG. 2c). In one embodiment, the composition of the first dielectric layer 23 comprises $M_zGe_yO_x$, wherein M is the stabilizing metal that stabilizes the germanium oxide network.

The second gate dielectric layer 24 is deposited over the first gate dielectric layer 23. The second gate dielectric layer 24 comprises a suitable high-k dielectric material and deposited by chemical vapor deposition (CVD), atomic layer deposition (ALD), metal organic chemical vapor deposition (MOCVD), physical vapor deposition (PVD), or jet vapor deposition (JVD), as examples. The second gate dielectric layer 24 comprises a thickness of about 5 Å to about 60 Å in one embodiment.

In the illustrated embodiment, the same dielectric layer is used to form the gate dielectric for both the p-channel and n-channel transistors. This feature is not, however, required. In alternate embodiments, the p-channel transistors and the n-channel transistors could each have different gate dielectrics. For example, in one embodiment, the second gate dielectric layer 24 for the p-channel and n-channel transistors can be chosen to be different. This allows independent optimization of the two devices.

Figure 4E:
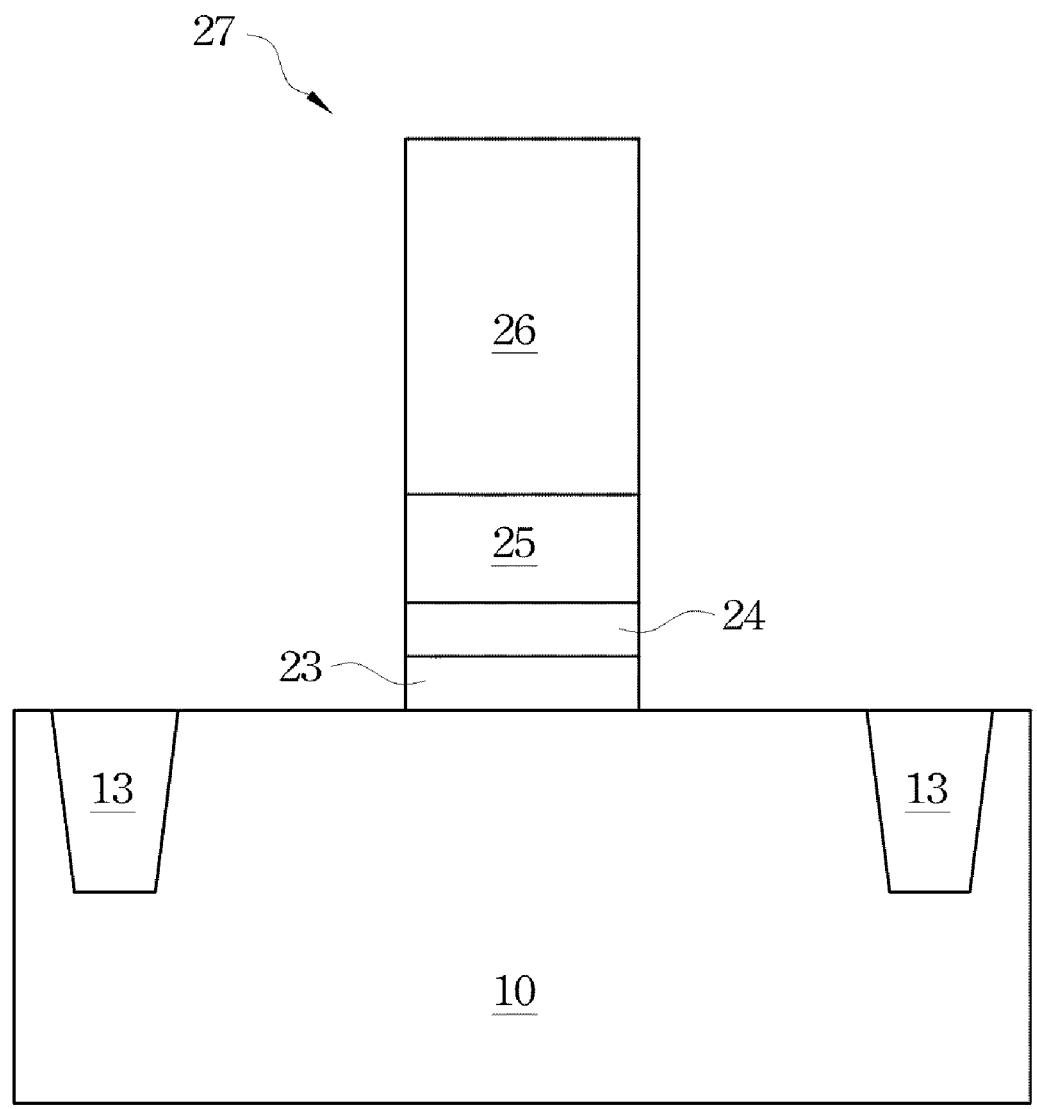

As illustrated in FIG. 4e, a gate electrode 27 is formed over the gate dielectric and patterned. The gate electrode comprises a first gate electrode layer 25 and a second gate electrode layer 26 as described in prior embodiments. The first gate electrode layer 25 substantially defines the work function of the gate electrode. The second gate electrode layer 26 may comprise a plurality of stacked gate materials, such as a metal underlayer with a polysilicon cap layer disposed over the metal underlayer.

P-channel and n-channel transistors include first gate electrode layer 25 formed from the same layers. In other embodiments, different types of transistors may comprise first gate electrode layer 25 of different materials and/or thicknesses.

The first and the second gate electrode layers 25 and 26 (and optionally the first and the second gate dielectric layers 23 and 24) are patterned and etched using known photolithography techniques to create the gate electrode 27 of the proper pattern.

Figure 4F:
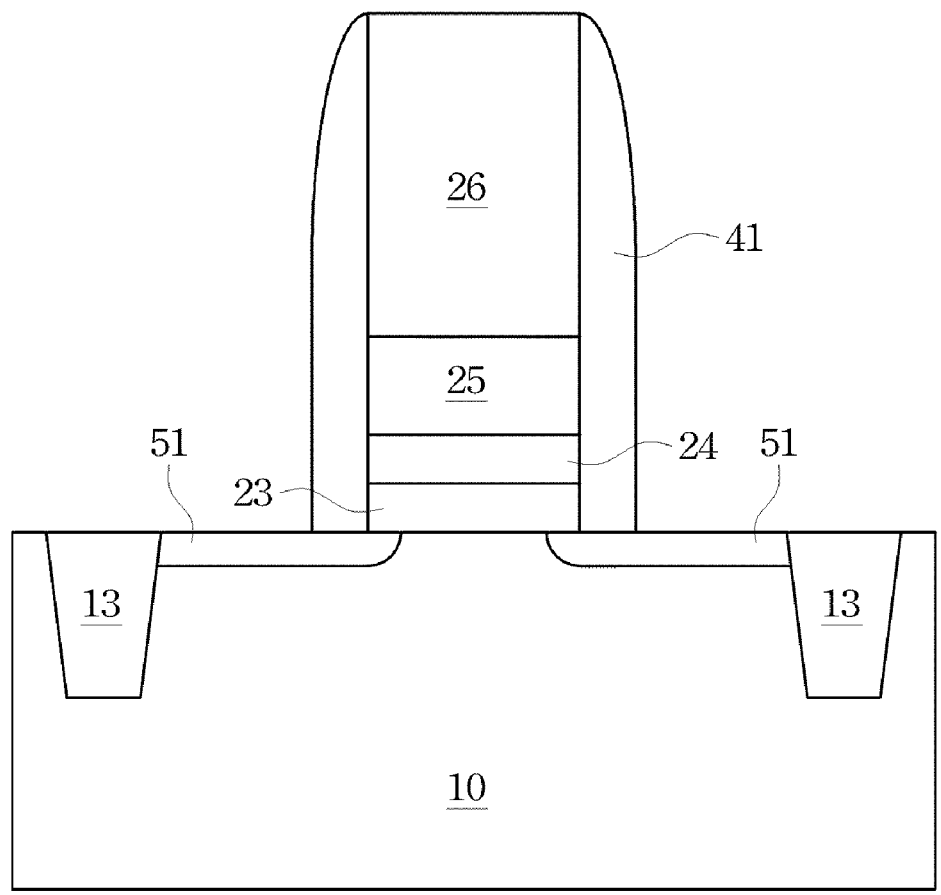

As illustrated in FIG. 4f, a thin layer of drain extension spacers 41 and source/drain extension regions 51 are formed. The drain extension spacers 41 are formed from an insulating material such as an oxide and/or a nitride, and can be formed on the sidewalls of the gate electrode 27. The drain extension spacers 41 are typically formed by the deposition of a conformal layer followed by an anisotropic etch. The process can be repeated for multiple layers, as desired.

The source/drain extension regions 51 can be implanted using the gate electrode 27 as a mask. Other implants (e.g., pocket implants, halo implants or double diffused regions) can also be performed as desired. The extension implants also define the channel 31 of the transistor.

If a p-type transistor is to be formed, a p-type ion implant along with an n-type halo implant is used to form the source/drain extension regions 51. If an n-type transistor is to be formed, an n-type ion implant along with a p-type halo implant is used to form the source/drain extension regions 51.

Figure 4G:
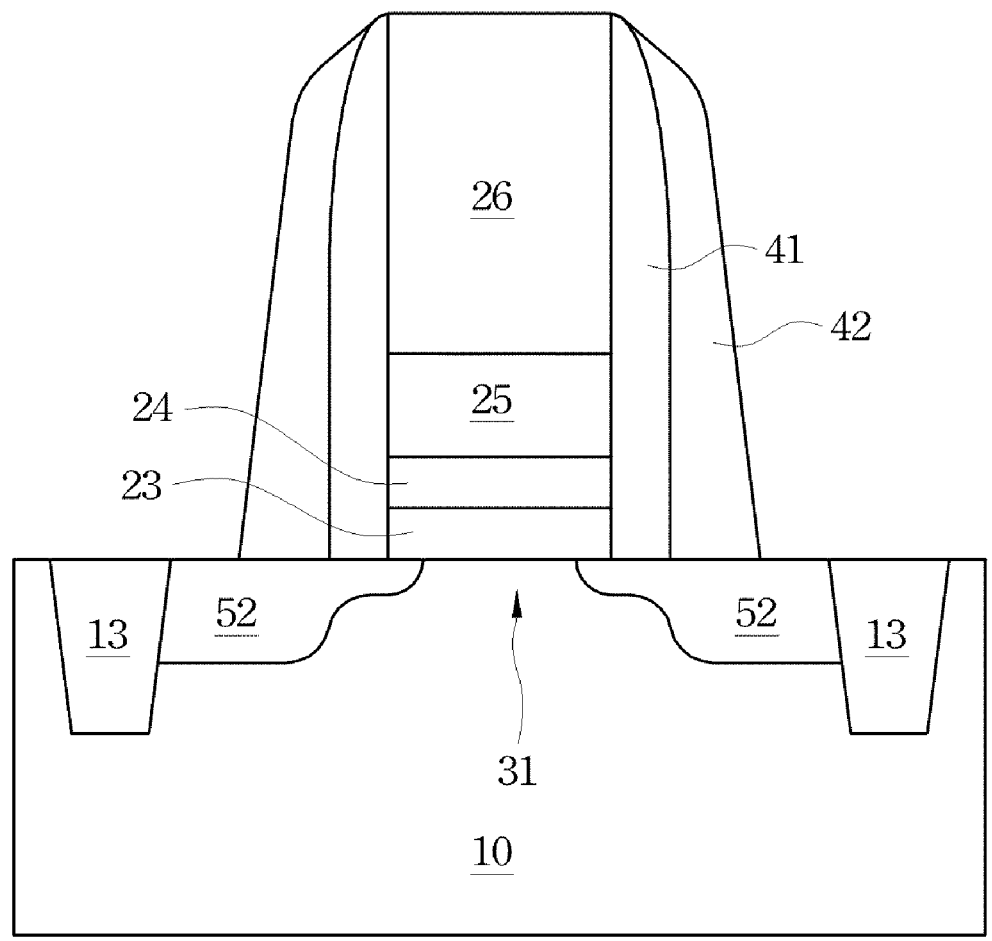

Referring to FIG. 4g, source/drain spacers 42 and source/drain regions 52 are formed. The source/drain spacers 42 are formed on the sidewalls of the drain extension spacers 41. The source/drain regions 52 are formed by implant and annealing. In some embodiments, the source/drain regions 52 may be grown epitaxially after forming a recess in the semiconductor substrate 10. In such embodiments, the source/drain regions 52 may comprise a material that strains the channel and/or minimizes source to drain leakage paths. A germanide is formed on the source/drain regions 52 to form contacts. Subsequent processing follows conventional semiconductor processing.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a germanium oxide layer over a substrate;
    forming a metal oxide layer over the germanium oxide layer;
    converting the germanium oxide layer and the metal oxide layer into a first dielectric layer; and
    depositing a first electrode layer over the first dielectric layer.

2. The method of claim 1, wherein the germanium oxide layer comprises fluorine, and wherein the first dielectric layer comprises fluorine.

3. The method of claim 1, wherein forming a germanium oxide layer comprises exposing the substrate to an oxygen plasma.

4. The method of claim 1, wherein forming a germanium oxide layer comprises exposing the substrate to an oxygen source and a fluorine source.

5. The method of claim 4, wherein the fluorine source comprises $NF_3$.

6. The method of claim 1, wherein the germanium oxide layer comprises a thickness of about 2 Å to about 20 Å, wherein the metal oxide layer comprises a thickness of about 2 Å to about 20 Å, and wherein the substrate comprises a germanium wafer, a germanium on insulator wafer, or a germanium layer on a semiconductor body.

7. The method of claim 1, wherein the metal oxide layer comprises a metal selected from the group consisting of Al, Hf, Ti, Ta, La, Zr, and W.

8. The method of claim 1, wherein the first dielectric layer comprises a metal germanate.

9. The method of claim 1, wherein the first dielectric layer comprises a material with a dielectric constant greater than a dielectric constant of the germanium oxide layer.

10. The method of claim 1, wherein converting the germanium oxide layer and the metal oxide layer comprises annealing the substrate.

11. The method of claim 1, wherein the first electrode layer comprises a material selected from the group consisting of TiN, TaN, MoN, HfN, and TiAlN.

12. The method of claim 1, further comprising forming a second dielectric layer on the first dielectric layer before depositing the first electrode layer, wherein the second dielectric layer comprises a material selected from the group consisting of $Al_2O_3$, $HfO_2$, $ZrO_2$, $Ta_2O_5$, $La_2O_3$, $TiO_2$, $Dy_2O_3$, $Y_2O_3$, $HfSiO_x$, $HfGeO_x$, $ZrSiO_x$, $ZrGeO_x$, $HfAlO_x$, $ZrAlO_x$, $SiAlO_x$, $GeAlO_x$, $HfSiAlO_x$, $HfGeAlO_x$, $ZrSiAlO_x$, $ZrGeAlO_x$, nitrides thereof, and combinations thereof.

13. The method of claim 1, further comprising depositing a second electrode layer over the first electrode layer, wherein the second electrode layer comprises polysilicon.

14. The method of claim 1, wherein the semiconductor device comprises a metal insulator field effect transistor.

15. A method of forming a semiconductor device, the method comprising:

forming a gate dielectric precursor layer over a substrate by (i) forming at least one germanium oxide layer and (ii) forming at least one metal oxide layer, and repeating steps (i) and (ii) until a desired thickness is achieved;

converting the gate dielectric precursor layer into a first gate dielectric layer; and depositing a first gate electrode layer over the first dielectric layer, wherein the first gate dielectric layer and the first gate electrode layer comprise regions of a germanium field effect transistor.

16. The method of claim 15, wherein the substrate comprises a germanium wafer, a germanium on insulator wafer, or a germanium layer on a semiconductor body, wherein the metal oxide layer comprises a metal selected from the group consisting of Al, Hf, Ti, Ta, La, Zr, and W, and wherein the first gate dielectric layer comprises a metal germanate.

17. The method of claim 15, wherein first gate electrode layer comprises a material selected from the group consisting of TiN, TaN, MoN, HfN, and TiAlN.

18. The method of claim 15, further comprising depositing a second gate dielectric layer on the first gate dielectric layer before depositing the first gate electrode layer, the second gate dielectric layer having a dielectric constant greater than the first dielectric layer.

* * * * *